(12) United States Patent
Ware et al.

(10) Patent No.: US 8,930,779 B2
(45) Date of Patent: Jan. 6, 2015

(54) BIT-REPLACEMENT TECHNIQUE FOR DRAM ERROR CORRECTION

(75) Inventors: Frederick A. Ware, Los Altos Hills, CA (US); Ely Tsern, Los Altos, CA (US); Thomas Vogelsang, Mountain View, CA (US)

(73) Assignee: Rambus Inc., Sunnyvale, CA (US)

( * ) Notice: Subject to any disclaimer, the term of this patent is extended or adjusted under 35 U.S.C. 154(b) by 262 days.

(21) Appl. No.: 13/505,449

(22) PCT Filed: Nov. 10, 2010

(86) PCT No.: PCT/US2010/056217
§ 371 (c)(1),
(2), (4) Date: May 1, 2012

(87) PCT Pub. No.: WO2011/062825
PCT Pub. Date: May 26, 2011

(65) Prior Publication Data
US 2012/0221902 A1  Aug. 30, 2012

Related U.S. Application Data

(60) Provisional application No. 61/263,080, filed on Nov. 20, 2009.

(51) Int. Cl.
  *G11C 29/00* (2006.01)
  *G11C 29/50* (2006.01)
  *G06F 11/10* (2006.01)
  *G11C 11/401* (2006.01)

(52) U.S. Cl.
  CPC ...... *G11C 29/50016* (2013.01); *G06F 11/1064* (2013.01); *G11C 29/808* (2013.01); *G11C 11/401* (2013.01)
  USPC .......................................... 714/710; 714/769

(58) Field of Classification Search
  CPC .. G11C 29/72; G11C 29/4401; G11C 29/808; G11C 11/401; G11C 29/50016; G06F 11/1064

USPC ............ 365/30.6, 163, 200; 714/33, 53, 718, 714/710, 769
  See application file for complete search history.

(56) References Cited

U.S. PATENT DOCUMENTS 4,398,248 A  8/1983  Hsia et al.
4,748,627 A  5/1988  Ohsawa
(Continued)

FOREIGN PATENT DOCUMENTS

JP    11-120788 A    4/1999
JP    2000-285695 A  10/2000
(Continued)

OTHER PUBLICATIONS

Barber et al., "A Bare-Chip Probe for High I/O, High Speed Testing," HPL-94-18, Mar. 1994, Hewlett-Packard. 19 pages.
(Continued)

*Primary Examiner* — David Ton
(74) *Attorney, Agent, or Firm* — Lance Kreisman; Peninsula Patent Group

(57) ABSTRACT

The disclosed embodiments provide a dynamic memory device, comprising a set of dynamic memory cells and a set of replacement dynamic memory cells. The set of replacement dynamic memory cells includes data cells which contain replacement data bits for predetermined faulty cells in the set of dynamic memory cells, and address cells which contain address bits identifying the faulty cells, wherein each data cell is associated with a group of address cells that identify an associated faulty cell in the set of dynamic memory cells. The dynamic memory device also includes a remapping circuit, which remaps a faulty cell in the set of dynamic memory cells to an associated replacement cell in the set of replacement cells.

48 Claims, 15 Drawing Sheets

(56) References Cited

U.S. PATENT DOCUMENTS

| | | | |
|---|---|---|---|
| 5,315,552 A | 5/1994 | Yoneda | |
| 5,644,541 A | 7/1997 | Siu et al. | |
| 5,758,056 A | 5/1998 | Barr | |
| 5,781,717 A | 7/1998 | Wu et al. | |
| 5,838,603 A | 11/1998 | Mori et al. | |
| 5,910,921 A | 6/1999 | Beffa et al. | |
| 6,011,734 A * | 1/2000 | Pappert | 365/200 |
| 6,112,321 A * | 8/2000 | Shimada et al. | 714/718 |
| 6,182,257 B1 | 1/2001 | Gillingham | |
| 6,188,618 B1 * | 2/2001 | Takase | 365/200 |
| 6,434,064 B2 * | 8/2002 | Nagai | 365/200 |
| 6,651,202 B1 * | 11/2003 | Phan | 714/733 |
| 6,754,117 B2 | 6/2004 | Jeddeloh | |
| 6,801,471 B2 * | 10/2004 | Viehmann et al. | 365/230.06 |
| 6,873,555 B2 | 3/2005 | Hiraki et al. | |
| 7,181,655 B2 * | 2/2007 | Ditewig et al. | 714/53 |
| 7,444,577 B2 | 10/2008 | Best et al. | |
| 7,464,225 B2 | 12/2008 | Tsern | |
| 7,478,285 B2 | 1/2009 | Fouquet-Lapar | |
| 7,522,464 B2 | 4/2009 | Yoo et al. | |
| 7,562,285 B2 | 7/2009 | Wang et al. | |
| 7,565,479 B2 | 7/2009 | Best et al. | |
| 7,565,593 B2 | 7/2009 | Dixon et al. | |
| 7,619,938 B2 | 11/2009 | Co et al. | |
| 7,676,730 B2 | 3/2010 | Haugan et al. | |
| 7,734,866 B2 | 6/2010 | Tsern | |
| 7,734,985 B2 | 6/2010 | Bains | |
| 7,783,957 B2 | 8/2010 | Carnevale et al. | |
| 7,831,882 B2 | 11/2010 | Tsern et al. | |
| 7,831,888 B2 | 11/2010 | Wang et al. | |
| 7,836,378 B2 | 11/2010 | Shaeffer et al. | |
| 7,882,423 B2 | 2/2011 | Wang et al. | |
| 7,961,542 B2 | 6/2011 | Smith | |
| 8,023,350 B2 | 9/2011 | Bunker et al. | |
| 8,132,077 B2 | 3/2012 | Wang et al. | |
| 8,132,086 B2 | 3/2012 | Park et al. | |
| 2002/0120887 A1 | 8/2002 | Hughes et al. | |
| 2002/0124203 A1 | 9/2002 | Fang | |
| 2004/0261049 A1 | 12/2004 | Mohr et al. | |
| 2005/0041502 A1 | 2/2005 | Perner | |
| 2006/0271755 A1 | 11/2006 | Miura | |
| 2007/0033338 A1 | 2/2007 | Tsern | |
| 2007/0109856 A1 | 5/2007 | Pellicone et al. | |
| 2007/0297252 A1 | 12/2007 | Singh | |
| 2008/0109700 A1 | 5/2008 | Lee et al. | |
| 2008/0195894 A1 | 8/2008 | Schreck et al. | |
| 2008/0215955 A1 | 9/2008 | Kimbara et al. | |
| 2008/0266990 A1 | 10/2008 | Loeffler | |
| 2008/0294841 A1 | 11/2008 | Carnevale et al. | |
| 2009/0003046 A1 * | 1/2009 | Nirschl et al. | 365/163 |
| 2009/0024884 A1 | 1/2009 | Klein | |
| 2009/0055714 A1 | 2/2009 | Bains et al. | |
| 2009/0129155 A1 | 5/2009 | Honda et al. | |
| 2009/0168569 A1 | 7/2009 | Ryu | |
| 2009/0235113 A1 | 9/2009 | Shaeffer et al. | |
| 2009/0276587 A1 | 11/2009 | Moyer et al. | |
| 2009/0316501 A1 | 12/2009 | Bunker et al. | |
| 2010/0107036 A1 | 4/2010 | Resnick | |
| 2010/0128541 A1 | 5/2010 | Russell et al. | |
| 2010/0208537 A1 | 8/2010 | Pelley, III et al. | |
| 2010/0293437 A1 | 11/2010 | Gollub et al. | |
| 2011/0016278 A1 | 1/2011 | Ware et al. | |
| 2011/0119551 A1 | 5/2011 | Tsern et al. | |
| 2011/0138251 A1 | 6/2011 | Pawlowski | |
| 2012/0221902 A1 | 8/2012 | Ware et al. | |
| 2013/0179751 A1 | 7/2013 | Linstadt | |

FOREIGN PATENT DOCUMENTS

| | | |
|---|---|---|
| JP | 2005-174462 A | 6/2005 |
| WO | WO-2012-051039 A1 | 4/2012 |

OTHER PUBLICATIONS

Niggemeyer et al., "A Defect-Tolerant DRAM Employing a Hierarchical Redundancy Scheme, Built-In Self-Test and Self-Reconfiguration," Proceedings, International Workshop on Memory Technology, Design and Testing, Aug. 11-12, 1997, Conference Publications, pp. 33-40. 8 pages.

PCT International Preliminary Report on Patentability dated May 31, 2012 (Chapter I) in International Application No. PCT/US2010/056217. 8 pages.

* cited by examiner

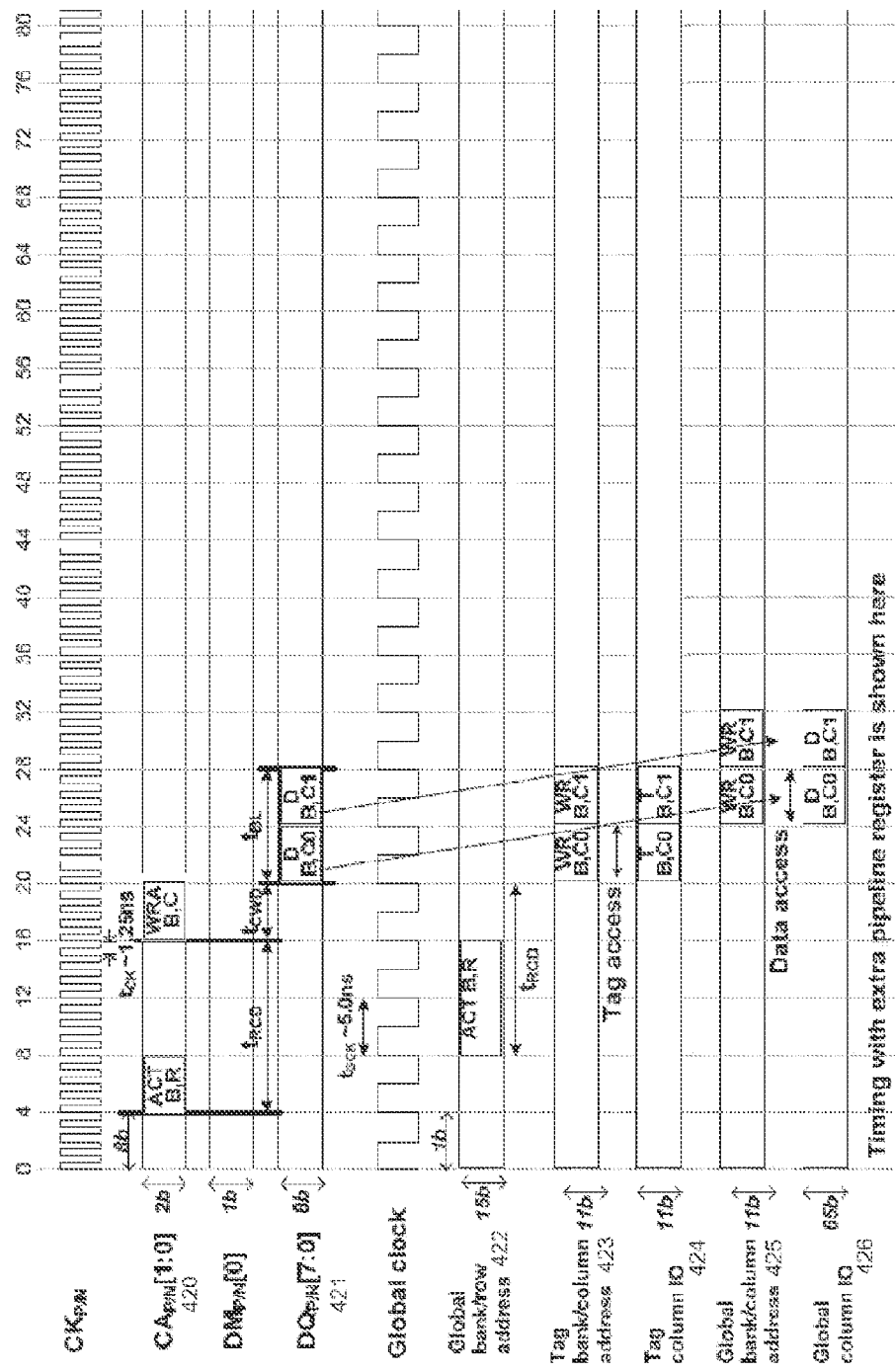

BIT-REPLACEMENT TECHNIQUE FOR DRAM ERROR CORRECTION

BACKGROUND

1. Field

The present disclosure relates to fault-tolerance techniques for semiconductor memory devices. More specifically, the present disclosure relates to a memory device which uses a bit-replacement technique to remap faulty memory cells to replacement cells.

2. Background

As feature sizes on DRAM devices continue to decrease, it is becoming progressively harder to maintain existing levels of memory-cell capacitance. Consequently, as feature sizes continue to decrease, memory-cell capacitance also decreases, which causes a corresponding decrease in data retention times. This means that a larger percentage of memory cells will be unable to meet minimum data retention time requirements, which can adversely affect manufacturing yield for DRAM devices.

BRIEF DESCRIPTION OF THE FIGURES

FIG. 4C illustrates the timing for a write operation in accordance with the disclosed embodiments.

DETAILED DESCRIPTION

Overview

In the embodiments disclosed, a memory device, which uses a new bit-replacement technique to remap faulty memory cells to replacement cells is described. The memory device maintains both tag information and replacement data bit(s) in dynamic storage, wherein the tag information keeps track of faulty (e.g., weak) memory cells. During a memory access which involves a faulty memory cell, the memory device maps a replacement data cell in place of the faulty memory cell. Address information which identifies the faulty cells is stored in the dynamic memory device. This address information enables the dynamic memory device to efficiently remap the faulty cells to replacement cells.

Also, some embodiments, the new bit-replacement technique can be used together with error correction coding (ECC) techniques. In this way, the new bit-replacement technique can be used to remap known faulty memory cells to replacement cells, while ECC techniques can be used to correct spurious transient errors that arise during system operation.

Various embodiments of the new bit-replacement technique are described below, but first we describe a memory system which uses this technique.

System

Figure 1:
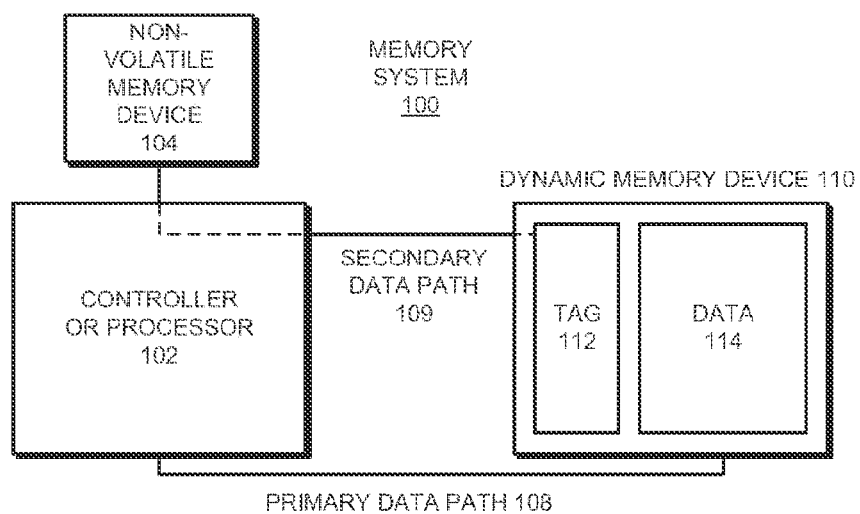
FIG. 1 illustrates a memory system in accordance with the disclosed embodiments.

FIG. 1 illustrates a memory system 100 in accordance with the disclosed embodiments. This memory system can generally be part of any type of computer system, including, but not limited to, a computer system based on a microprocessor, a mainframe computer, a digital signal processor, a portable computing device, a personal organizer, a cell phone, a device controller, or a computational engine within an appliance.

Memory system 100 includes a controller or processor 102, which communicates with one or more dynamic random access memory devices (hereinafter "dynamic memory devices"), including dynamic memory device 110. This controller or processor 102 can generally be a stand alone chip or be included as part of any type of system-on-chip (SOC), processor, or computer system component that communicates with memory device, such as a memory controller or a processor. Controller or processor 102 is also coupled to a non-volatile memory device 104, such as a flash memory.

Dynamic memory device 110 can be any type of random-access memory device, such as a synchronous DRAM, which stores data in dynamic memory cells that need to be periodically refreshed. More specifically, dynamic memory device 110 contains a set of dynamic memory cells which are used to store data 114, and a set of replacement dynamic memory cells, which are used to store tag information 112. This tag information 112 includes data cells which contain replacement data bits for predetermined faulty cells in the set of dynamic memory cells, and address cells which contain address bits identifying location(s) of the faulty cells. More specifically, tag information 112 can include "column-address" information, "column-select" information, "replacement-data-bit" information and "enable-control" information. (A "weak" cell is a cell which cannot store a '1,' a '0,' or both over the specified retention time in any specified operation for any reason. A "weak" cell belongs to the low retention time tail of the retention time distribution of all cells. A "faulty" cell can include a weak cell, but can more generally include any cell that malfunctions for any reason.)

Each data cell is associated with a group of address cells that identify an associated faulty cell in the set of dynamic memory cells. Dynamic memory device 110 also includes a remapping circuit (not shown), which is configured to remap a faulty cell to an associated replacement cell. This remapping circuit is described in more detail below. Dynamic memory device 110 may also include an identifier, such as a serial number, which identifies dynamic memory device 110.

During system initialization, controller or processor 102 transfers tag information 112 from non-volatile memory device 104 to dynamic memory device 110. (It should be noted that tag information could also be stored in other locations in the system, including in either volatile or non-volatile storage on the controller or processor 102, or in other chips in the system that might have volatile or non-volatile storage.) This tag information 112 can be transferred across a primary data path 108, which is used to perform normal memory accesses. Alternatively, tag information 112 can be transferred across a secondary data path 109, such as an I²C bus, or a dedicated serial interface.

Dynamic Memory Device

Figure 2A:
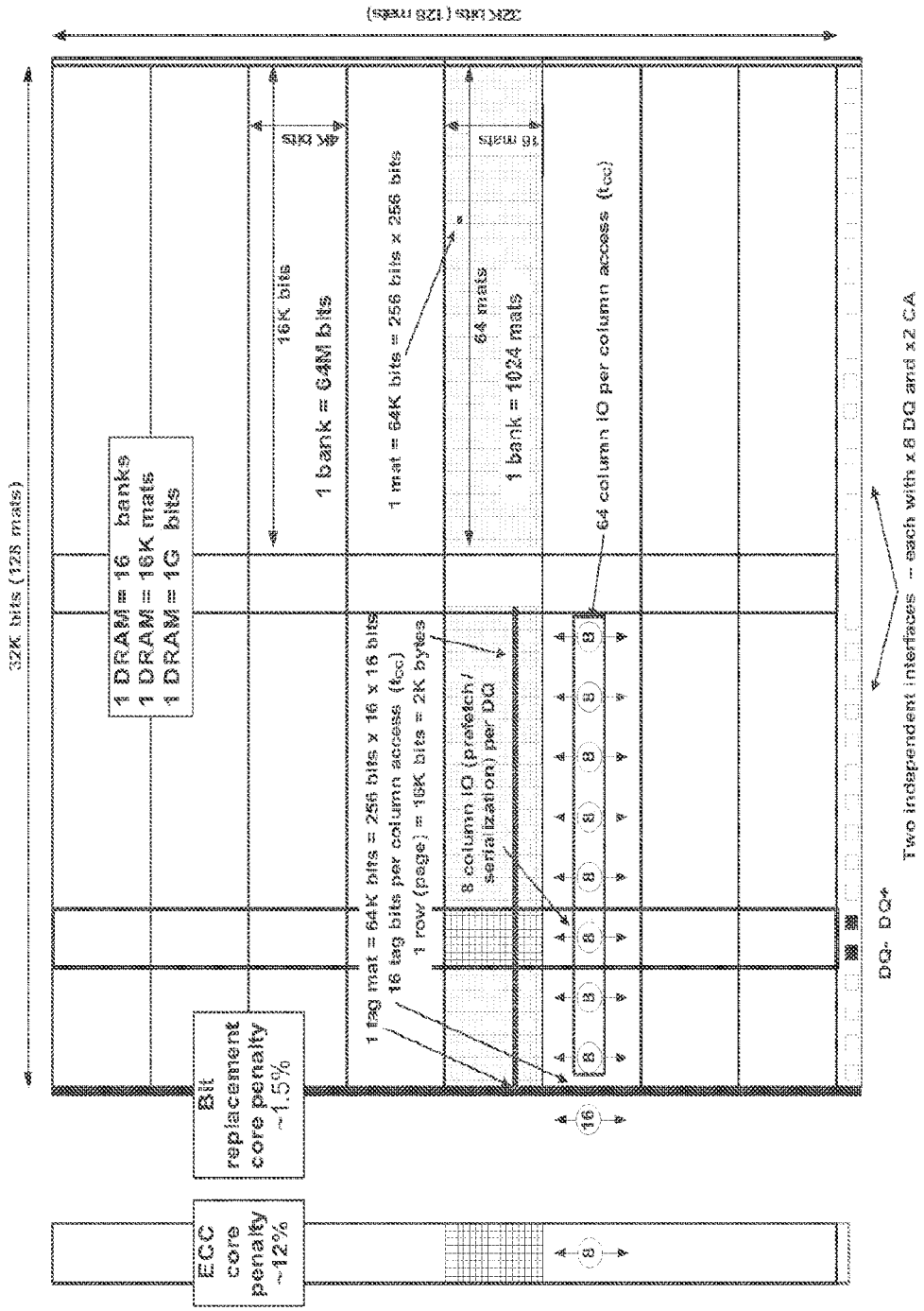
FIG. 2A illustrates a memory device in accordance with the disclosed embodiments.

FIG. 2A illustrates the structure of a dynamic memory device in accordance with one or more embodiments. As illustrated in FIG. 2A, this dynamic memory device comprises a set of "mats" which are organized into rows and columns. (Each mat is illustrated as a tiny square in FIG. 2A.) In the illustrated embodiment, each mat includes 64K bits of data. In the illustrated memory device, there are 16K "data mats" containing data bits, and 256 "tag mats" storing tag information for a total storage capacity of about 1 G bits. (The tag mats are organized slightly differently and have more access wires.) During a memory access, a word line from a row decoder selects a specific row, which runs through 64 mats. Next, column-decode logic selects a single bit from each of the 64 mats. (The 64 selected bits constitute a dataword which is the target for the memory access. This dataword feeds through one of the two interfaces located at the bottom of FIG. 2A.) Moreover, there can exist differing numbers of bits per mat. For example, in another implementation there are 16 mats delivering four bits each. (instead of 64 mats delivering one bit each).

In addition to the columns which store data, there is a single column of tag mats (highlighted in black on the left-hand side of FIG. 2A) that stores tag information which can be used to remap faulty memory cell in each row. In the illustrated embodiment, this single additional column requires an overhead of about 1.5% additional memory storage.

Figure 2B:
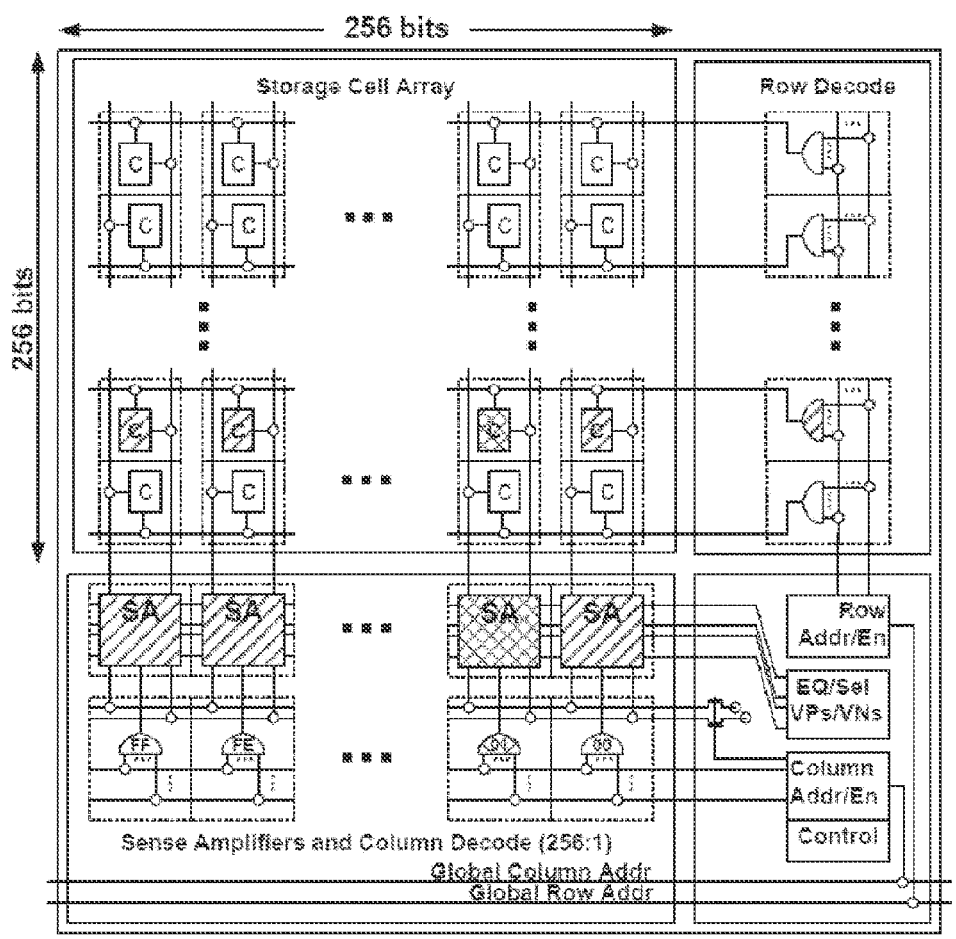
FIG. 2B illustrates a data mat element which stores data in accordance with the disclosed embodiments.

Referring to FIG. 2B, each mat element storing data is organized, in an embodiment, as a 256-bit by 256-bit array including row-decode logic, sense amplifiers and column-decode logic. During a memory access, eight of the address bits feed into the row-decode logic in the mat element and are used to select a specific row out of the 256 rows in the mat element. This is illustrated by the row containing memory cells and row-decode logic which are highlighted by hatching in FIG. 2B. Another eight address bits feed into column-decode logic, which is used to select a specific column out of the 256 possible columns in the mat element. This is illustrated by the memory cell, sense amplifier and column-decode logic which are highlighted by crosshatching in FIG. 2B. When this row- and column-decoding process completes, a single, bit out of the 64K bits in the mat element is selected.

Figure 2C:
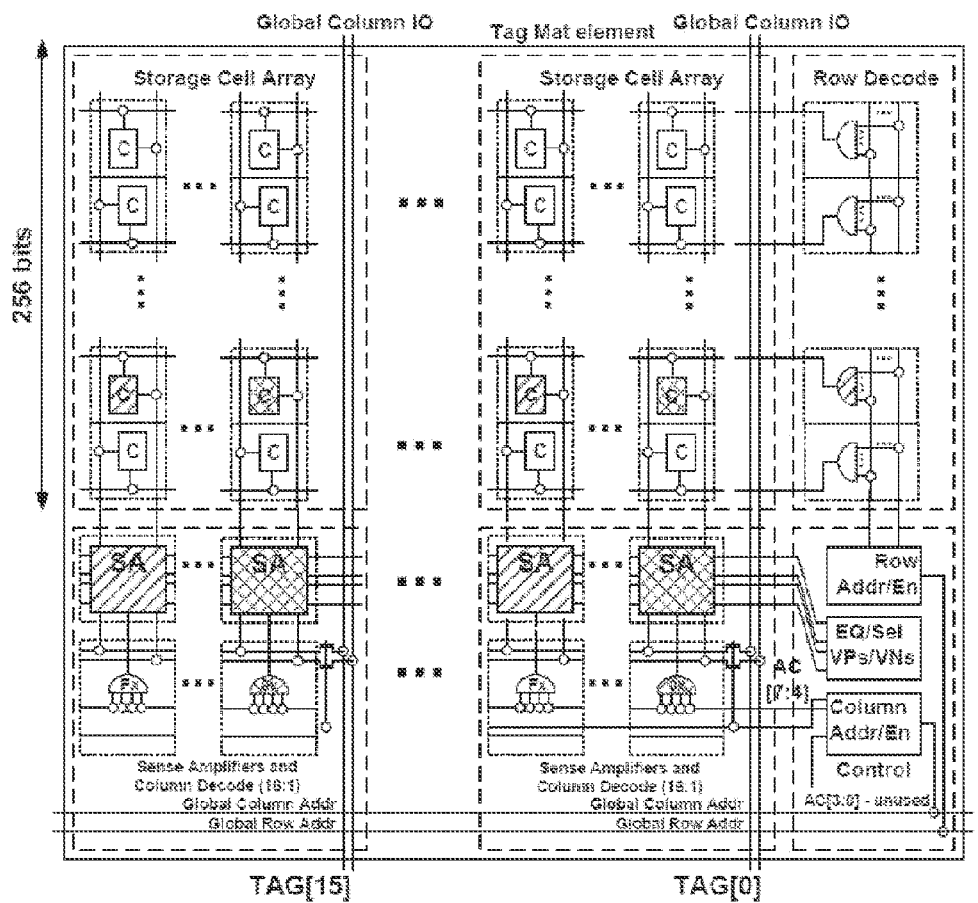
FIG. 2C illustrates a tag mat element which stores tag information in accordance with the disclosed embodiments.

A "tag mat" element which stores tag information has a slightly different structure as is illustrated in FIG. 2C. A tag mat element is also organized as a 256-bit by 256-bit array, and it contains the same type of memory cells and sense amplifiers as the data mat element illustrated in FIG. 2B. However, instead of outputting a single bit during each memory access, a tau mat element outputs 16 bits. During a memory access, the row decoding is the same as for the data mat element illustrated in FIG. 2B. Hence, eight of the address bits feed into row-decode logic the tag mat element and are used to select a specific row out of the 256 possible rows in the tag mat element. This is illustrated by the row containing memory cells and row-decode logic which is highlighted by hatching in FIG. 2C. However, the column decoding is slightly different. Only four address bits are used for the column decoding. These four address bits select 16 columns out of the 256 possible columns in the tag mat element, and these 16 columns appear as TAG[0..15]. This is illustrated by memory cells, sense amplifiers and column-decode logic which are highlighted by crosshatching in FIG. 2C. A tag mat element includes additional column fines to accommodate all 16 tag bits.

Tag-Matching Circuitry for a Read

Figure 3A:
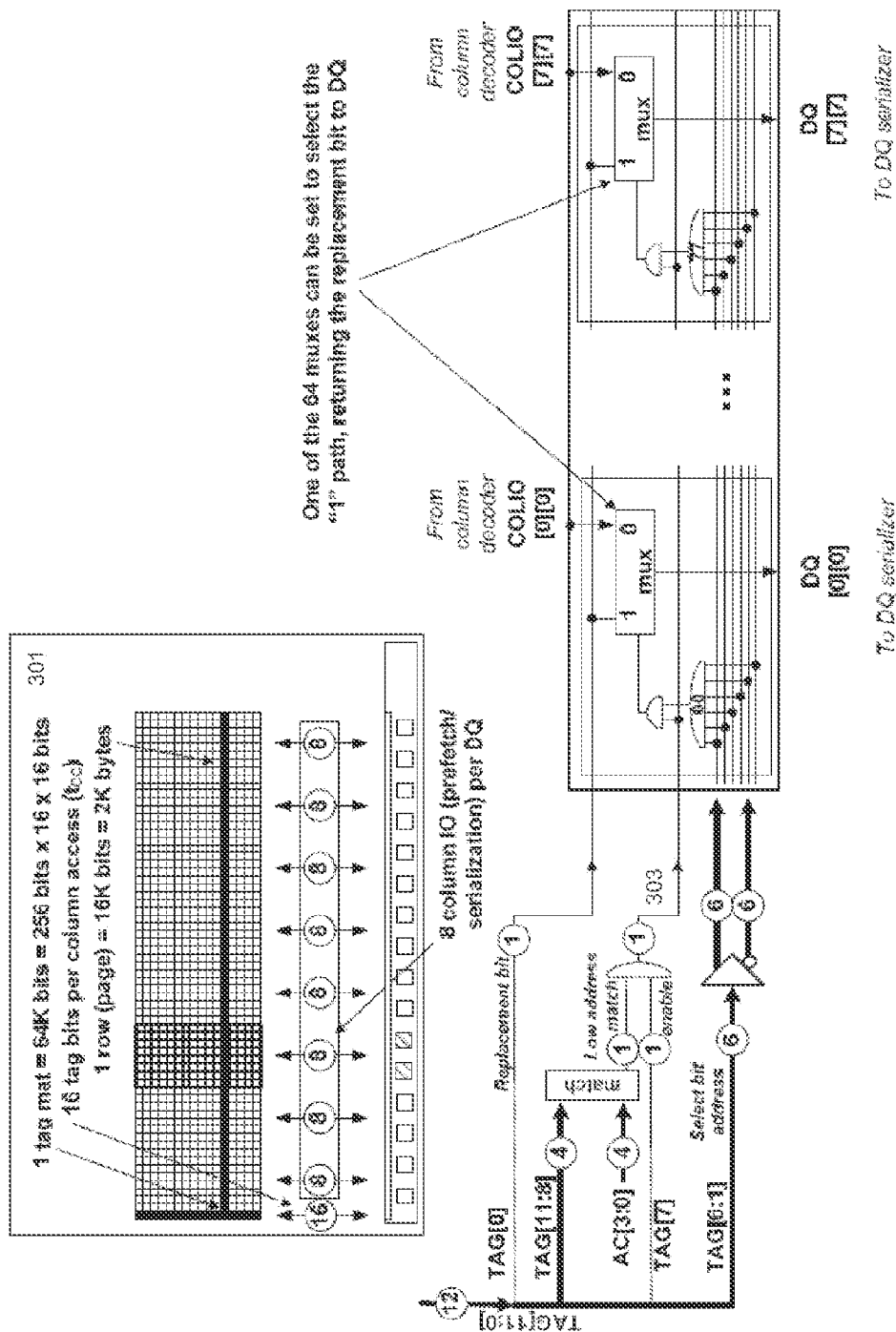
FIG. 3A illustrates tag-matching circuitry for a read operation in accordance with the disclosed embodiments.

FIG. 3A illustrates tag-matching circuitry for a read operation in accordance with the disclosed embodiments. Referring to the inset box 301, each memory access is associated with 64 data bits (shown as 8 column groups of 8 bits each) and an additional column, which contains a 16-bit tag, which is represented as TAG[15..0]. The tag-matching circuitry illustrated in FIG. 3A operates the lower-order 12 bits of this tag, namely TAG[11..0]. The four bits in TAG[15..12] are unused in this embodiment, but might be used in other embodiments which need larger address or data fields in the tag.

TAG[0] contains a single replacement data bit for a faulty cell, although other embodiments associate multiple data bits (for example, 2 or 4) with each tag. The determination of the optimal number of bits to associate with each tag can be empirically determined based on characteristics of a representative pattern of memory references and a representative pattern of faulty memory cells.

Four of the tag bits TAG[11:8] are compared against the three lowest-order address bits AC[3:0]. If these match, and if an enable bit TAG[7] is also set (which indicates that the tag contains a valid replacement cell), MUX enable signal 303 goes high. Finally, six or the tag bits TAG [6:1] are used to select a specific bit to be remapped out of the selected 64-bit dataword located at the memory address.

The tag-matching circuitry illustrated in FIG. 3A effectively implements a direct-mapped cache. Within this direct-mapped cache, four higher-order address bits AC[7:4] are used to select a set of 16 tag bits (which contain the 12-bit tag) from the 256 bits in the selected row of the tag mat element (sec FIG. 2C). Next, as mentioned above, tag bits TAG[11:8] are compared against the three lowest-order address bits AC[3:0] to determine whether the tag matches the address of the memory access, which indicates that a bit replacement should take place. Hence, the tag-matching circuitry illustrated in FIG. 3A implements a direct-mapped cache which stores a single tag for a single address out of 16 possible addresses that can be associated with the selected tag.

Note that, unlike a system that implements a standard ECC, a system that uses the new bit-replacement technique system does not have to perform a function across all 64 bits of the dataword (and the associated 8-bit syndrome) to correct an error. Hence, circuitry illustrated in FIG. 3A is much simpler and faster than circuitry that implements a standard Hamming-code based ECC. Moreover, a standard ECC, which operates across an entire 64-bit dataword, also suffers from a "data mask" problem, which arises when a memory reference accesses only a subset of the eight bytes in the 64-bit dataword. For example, even if only one byte of the 64-bit dataword is updated, the entire 64-bit dataword must first be read, and the Hamming code must be recomputed across all 64-bits of the dataword before the update to the single byte can be committed. This makes it awkward to perform byte updates.

Figure 3B:
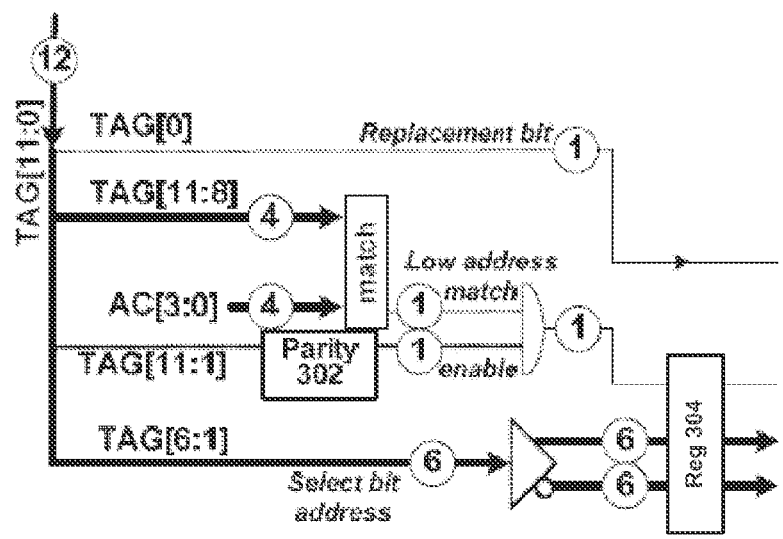
FIG. 3B illustrates tag-matching circuitry with parity logic and a pipelining register in accordance with the disclosed embodiments.

It is also desirable to perform error detection and correction for the tag bits themselves. For example, FIG. 3B illustrates a variation of the tag-matching circuitry which stores a parity bit for the tag in place of the enable bit in TAG[7]. This embodiment uses a parity circuit 302 to perform a parity check across tag bits [11:1]. The output of this parity circuit 302 generates an enable if parity is preserved across bits [11:1]. Otherwise, if parity is not preserved, the associated tag has been corrupted, and the bit replacement will not take place. Referring back to FIG. 1, in this case, the tag information 112 cart be reloaded from non-volatile memory device 104 (or, alternatively, from a volatile memory device). In an alternative embodiment, instead of performing a parity check to provide error detection, the system computes a Hamming code across the 12-bit tag to provide both error detection and correction. This Hamming code requires a 4-bit syndrome to correct a single-bit error in the 12-bit tag for a total of 16 bits or, alternatively, a 5-bit syndrome to correct a single-bit error and also to detect a double-bit error for a total of 17 bits.

FIG. 3B also illustrates a pipeline register 304, which can be used to store the results of a preceding tag comparison, so that the tag-matching operation can be pipelined with a preceding data access. This is useful if the tag-matching circuitry is too slow to keep pace with desired memory access speeds.

Figure 3C:
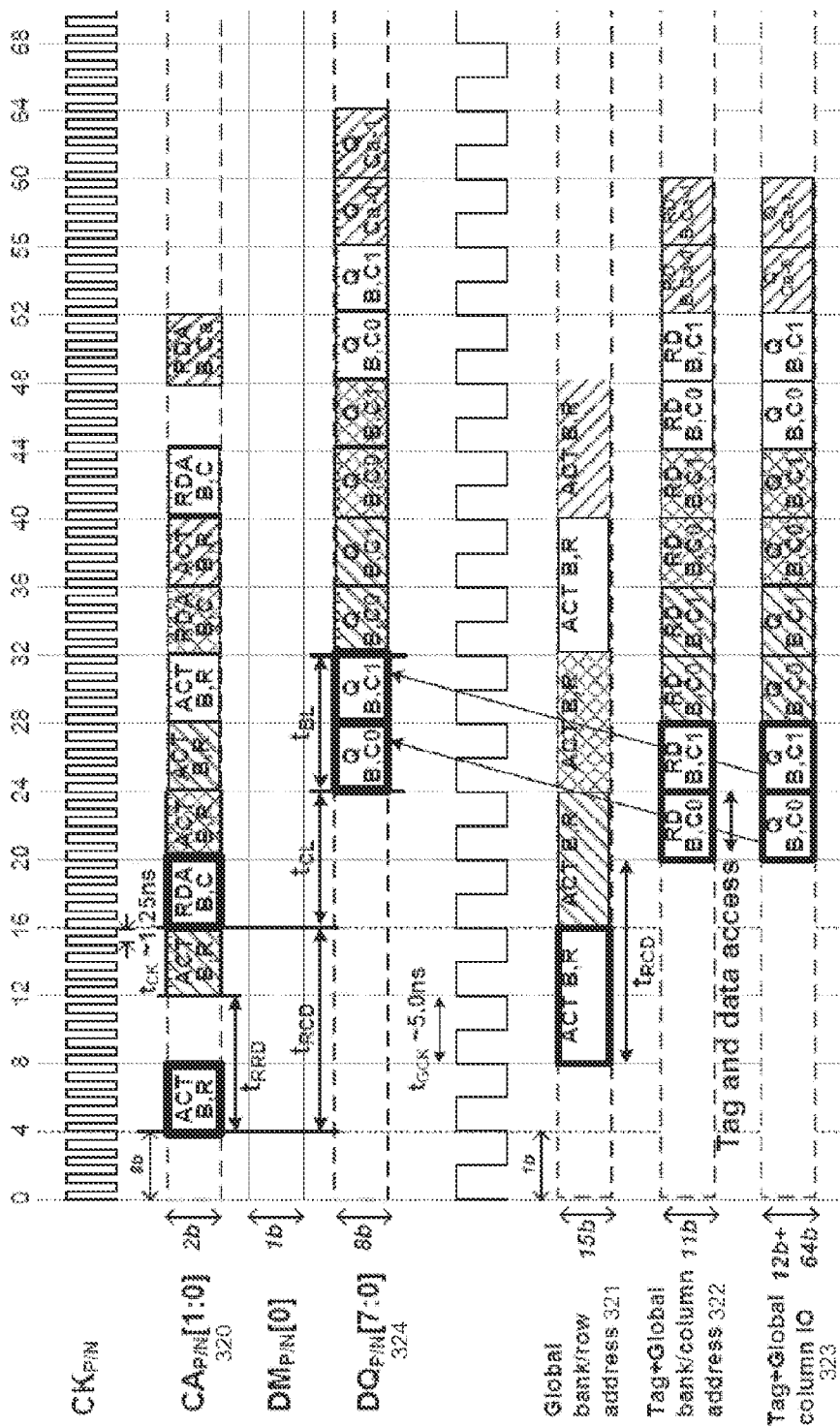
FIG. 3C illustrates the timing for a read operation in accordance with the disclosed embodiments.

FIG. 3C presents a timing diagram for a read operation in accordance with the disclosed embodiments. Referring to the read transaction indicated by the double-bold lines in FIG. 3C, an activate command $ACT_{B,R}$ and a row address, which opens up a row for the read transaction, is first sent to the memory device through control/address lines $CA_{P/N}[1:0]$ lines 320. This activate command propagates to the global bank/row address lines 321 in the next cycle. Then, a column-access read command $RDA_{B,C}$ is sent to the memory device across $CA_{P/N}[1:0]$ lines 320. This column-access read command propagates to the tag+global bank/column address lines 322 in the next cycle. Finally, the read data appears on tag+global column I/O lines 323. In the next cycle, the read data propagates out through data lines $DQ_{P/N}[7:0]$ 324. (However, if the read transaction is pipelined, for example by using pipeline register 304 illustrated in FIG. 3B, the data appears a cycle later.)

Tag-Matching Circuitry for a Write

Figure 4A:
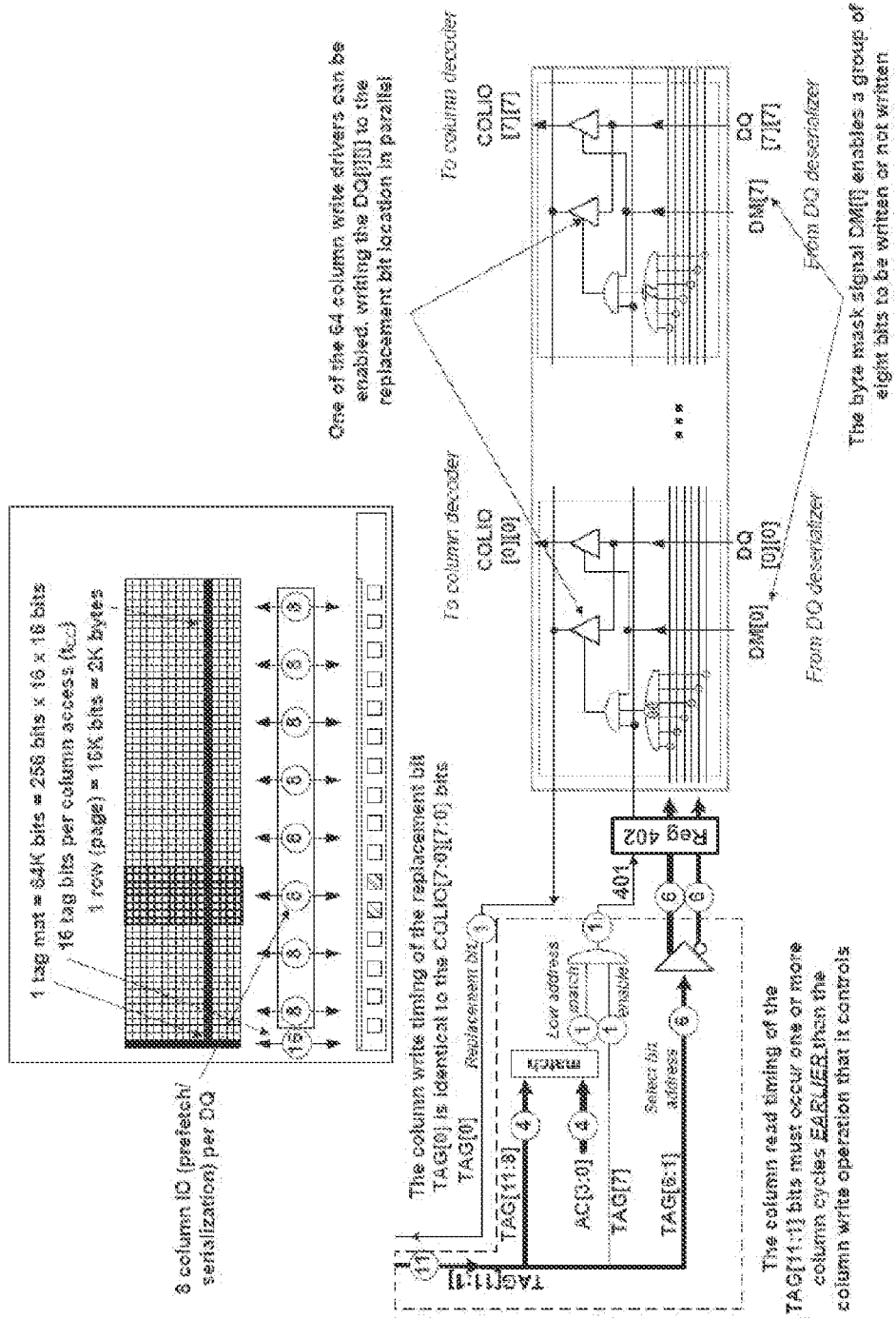
FIG. 4A illustrates tag-matching circuitry for a write operation in accordance with the disclosed embodiments.

FIG. 4A illustrates tag-matching circuitry for a write operation in accordance with the disclosed embodiments. This tag-matching circuitry is similar to the read tag-matching circuitry illustrated in FIG. 3A, except that the write data propagates in the opposite direction as the read data. Also, a pipeline register 402 is provided, which is used to store the results of a preceding tag comparison so that the tag-matching operation can pipelined with a preceding data access. More specifically, the column-read operations to obtain the TAG [11:1] bits must occur at least one cycle earlier than the associated column-write operation that is being controlled. Adding an additional stage of latency to write operations will have little effect on system performance, because subsequent processing operations typically do not have to wait for preceding write operations to complete. Another difference is that eight data mask bits DM[7:0] are used (in addition to tag bits TAG[6:1] and enable signal 401) to enable groups of eight consecutive bits (bytes) to be written or not written.

Figure 4B:
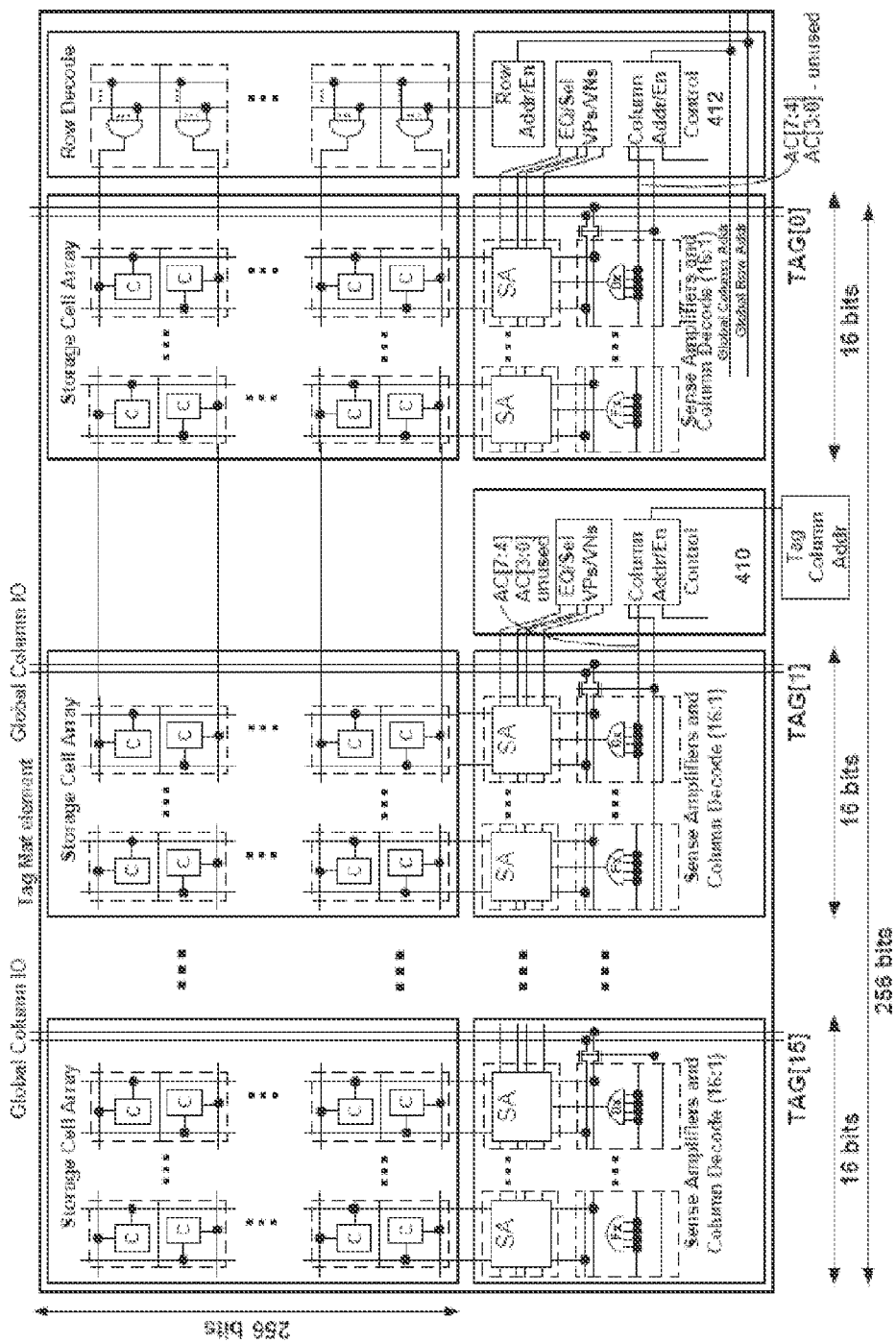
FIG. 4B illustrates a tag mat element with circuitry to support pipelining circuitry in accordance with the disclosed embodiments.

FIG. 4B illustrates a tag mat element with circuitry to support pipelining in accordance with the disclosed embodiments. This tag mat element ix the same as the tag mat element illustrated in FIG. 2C, except that it contains two sets of circuitry to provide column addresses 410 and 412. The first set 410 provides a column address to perform a tag lookup for a subsequent memory access, while the second set 412 provides a column address to access a replacement data bit for a current memory access. Hence, the tag access occurs in cycle (t) and the data access occurs in cycle (t+1). In some embodiments, this pipelining takes place during write operations, but not during read operations. In other embodiments, this pipelining takes place during both write and read operations.

FIG. 4C illustrates timing for a write operation in accordance with the disclosed embodiments. First, an activate command $ACT_{B,R}$, which opens up a row for the write transaction, is sent to the memory device through $CA_{P/N}[1:0]$ lines 420. This activate command propagates to the global bank/row address lines 422 in the next cycle. Then, a column-access write command $WRA_{B,C}$ is sent to the memory device across $CA_{P/N}[1:0]$ lines 420. This column-access write command propagates to the tag bank/column address lines 423 in the next cycle. In this next cycle, a tag access takes place in tag I/O lines 424. Also, in the same cycle, write data ($D_{B,C0}$ and $D_{B,C1}$) is sent to the memory device across data lines $DQ_{P/N}$ [7:0] 421. In the following cycle, the write data propagates to global column I/O lines 426, and the column-access write command propagates to global bank/column address lines 425 to complete the write operation. In this pipelined write operation, the tag access (on tag column I/O lines 424) is one cycle ahead of the associated write data (on global column I/O lines 426).

In an alternative timing approach, the tag information is read by an internally (inside the DRAM) generated read command directly after completion of the activate command and stored in latches. The comparison and eventual replacement (both during reads and writes) operates on the latched tag address and replacement data bits. When a precharge command is issued, it is delayed internally and preceded by an internally generated write command which writes the data bits from the latch back into the memory array. In this way, tag information is never read or written at the same time as the regular array data. It can therefore be stored in additional columns in the regular data mats and does not require the special tag array with the non-standard bit access width and the different column decoders. The trade-off for this simplification of the array structure is increased row cycle time (which involves extending an ACT by the duration of a READ and extending a PRE by the duration of a WRITE).

Error Analysis

Figure 5A:
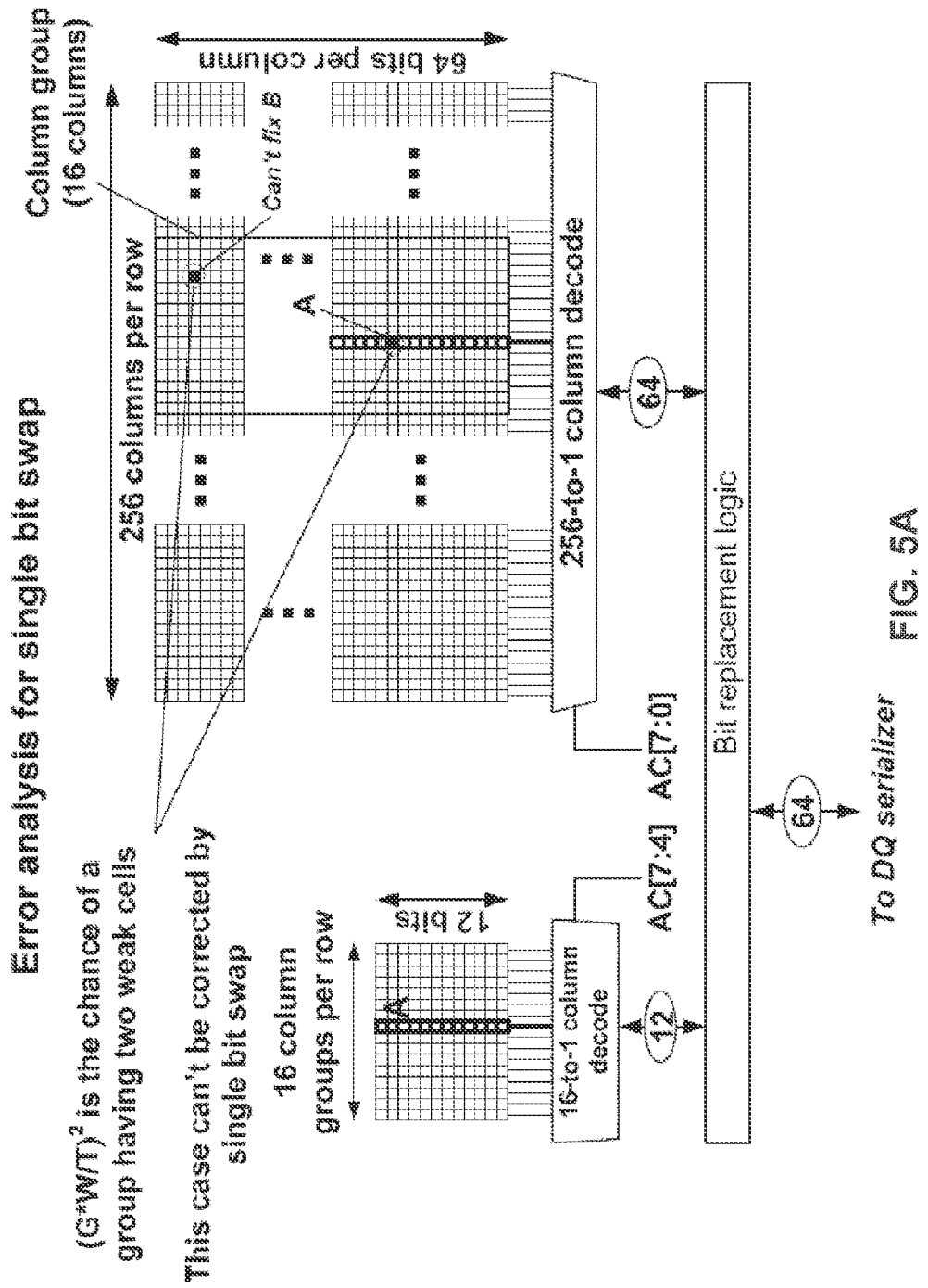
FIG. 5A provides an error analysis for a memory device with a single additional tag column in accordance with the disclosed embodiments.

FIG. 5A illustrates an error analysis for a memory device with a single additional column containing tag information in accordance with disclosed embodiments. In FIG. 5A, the tag bits are stored in the smaller array on the left-hand side of the figure. This smaller array has a 16-to-1 column decoder, which uses four address bits AC [7:4] to select one of 16 possible column groups for each row. In contrast, the larger data array, located on the right-hand side of FIG. 5A, has a 256-to-1 column decoder which uses eight address bits AC[7:0] to select one of 256 possible columns per row. Hence, in a given row, there are 16 possible data columns for each 12-bit tag. This means only a single tag is available to correct the errors for a column group which contains 16 columns. (This is illustrated by the 16 column-wide column group illustrated in FIG. 5A.)

Hence, only one faulty cell can be remapped in each column group. If the probability of a faulty cell occurring in a column group is p=(G*W/T), where G=64 b is the size of the correctable column group, W is the total number of faulty cells that can be tolerated, and T=1 Gb is the total memory device capacity, the probability of two or more faulty cells occurring in the same column group is $p^2$. If this occurs, only one of the two faulty cells can be remapped. The yield loss due to two bit errors is too high, because it is either not possible or not desirable to refresh more often and to recover some of the faulty cells.

Figure 5B:
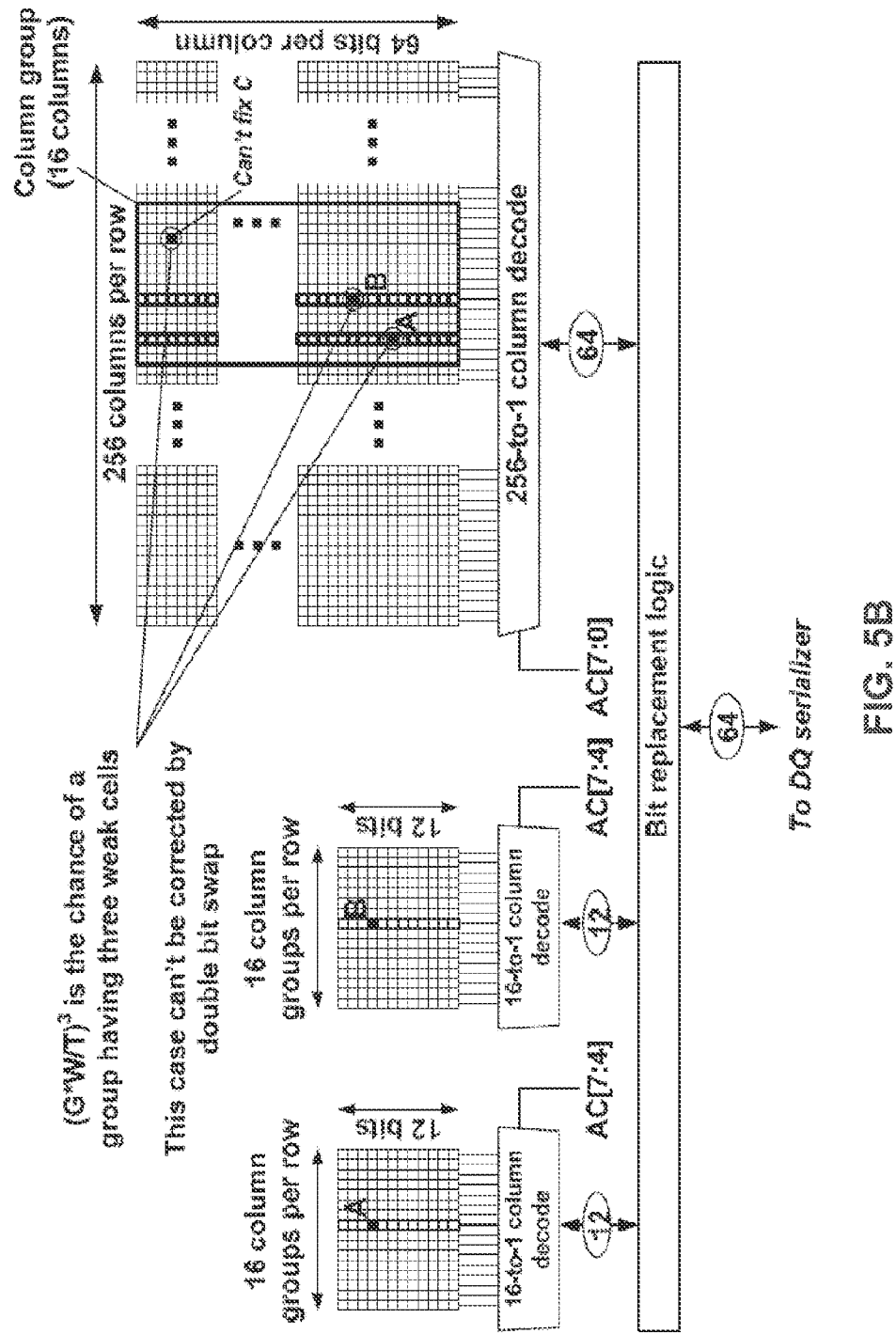
FIG. 5B provides an error analysis for a memory device with two additional tag columns in accordance with the disclosed embodiments.

In some cases, it may be desirable to provide two columns containing tag information as is illustrated in FIG. 5B. This embodiment requires two additional columns to store tag information, but it also provides up to two replacement cells for each column group. This means that up to two faulty cells can be remapped in each column group. If the probability of a faulty cell occurring in a column group is p, the probability of three or more faulty cells occurring in the same column group is $p^3$.

Manufacturing Process

Figure 6A:
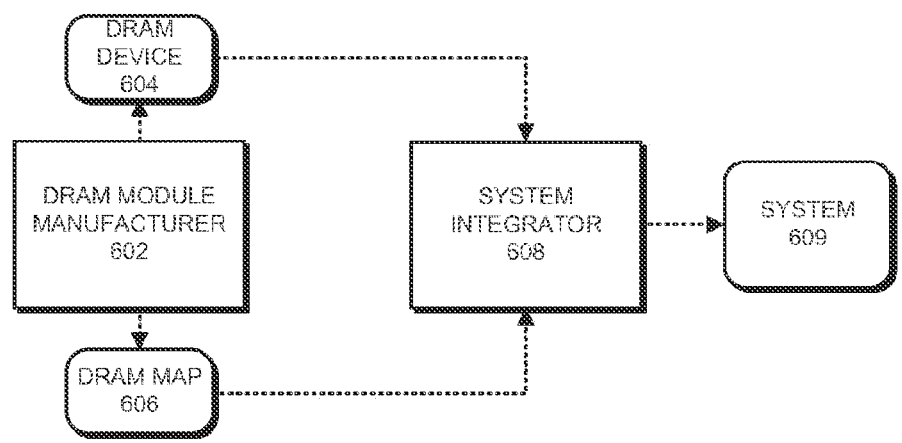
FIG. 6A presents a diagram illustrating how a DRAM device and an associated DRAM map are sent between DRAM module manufacturer and a system integrator in accordance with the disclosed embodiments.

FIG. 6A presents a diagram illustrating how a DRAM device 604 and an associated DRAM map 606 are sent between DRAM-module manufacturer 602 and a system integrator 608 in accordance with the disclosed embodiments. First, the DRAM-module manufacturer 602 produces a DRAM device 604. This DRAM device 604 can either be a single DRAM chip, or a DRAM chip which is integrated into a chip carrier module. Next, after the DRAM device 604 is manufactured, the DRAM device 604 is tested to see how long each cell in the DRAM device retains a data bit. Results of this testing process are compiled into a DRAM map 606, which identities faulty memory cells in DRAM device 604. For example, these faulty memory cells may have shorter retention times than other dynamic memory cells in the memory device.

Next, DRAM device 604 and DRAM map 606 are sent to a system integrator 608. For, example DRAM device 604 can be sent to system integrator 608 through surface mail, and DRAM map 606 can be sent to system integrator 608 through a computer network, such as the Internet. System integrator 608 then integrates the DRAM device 604 and DRAM map 606 into a system 609 which, for example, can be a computer system. Referring back to the memory system illustrated in FIG. 1, this can involve storing the DRAM map 606 in non-volatile memory device 104, so that the information in the DRAM map 606 can be loaded into tag information 112 in dynamic memory device 110 during system initialization. (As mentioned above, this tag information can alternatively be stored in a volatile memory device so long as power is maintained to the volatile memory device.)

DRAM map 606 does not necessarily have to be generated bye DRAM-module manufacturer 602. DRAM map 606 can alternatively be generated through testing operations performed by the system integrator 608. The assembled, or partially assembled system could support DRAM testing (e.g., bypass access to a DRAM tester and/or test support in the controller) that would generate the DRAM map results for the DRAM devices in the system. The DRAM map could then be stored in non-volatile storage in the system that initializes the DRAM device. The DRAM map information could also be sent back to the DRAM manufacturer to provide feedback on production yield for further yield improvements. Alternatively, the DRAM map could be generated and/or updated through testing operations which are automatically performed by a computer system 609, for example, during a system boot-up process or during nm-time as a maintenance operation.

System Initialization

Figure 6B:
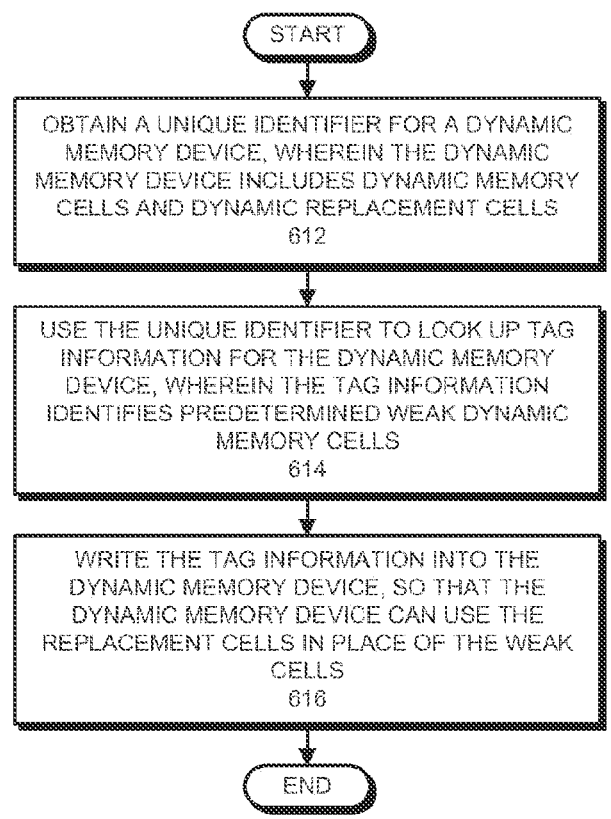
FIG. 6B presents a flow chart illustrating how tag information is initialized in a memory device in accordance with the disclosed embodiments.

FIG. 6B presents a flow chart illustrating how tag information is initialized in a dynamic memory device in accordance with the disclosed embodiments. This initialization process can occur, for example, during a boot sequence for a computer system. First, the system obtains identification information, such as a manufacturing serial number, for the dynamic memory device (step 612). (In some cases, this identifier can be read from the memory device.) Next, the system uses the identification information to obtain tag information for the dynamic memory device (step 614). For example, referring to FIG. 1, the system can look up the tag information 112 based on the identification information from non-volatile memory device 104 (or possibly from a volatile memory device). Alternatively the identification information could be used to look up tag information that resides on a separate computer and that specific tag information can be loaded to the system being configured. Finally, the system writes the tag information into a set of dynamic memory cells in dynamic memory device 110 (step 616). This tag information 112 contains addresses which identify faulty cells in the dynamic memory cells, so that the dynamic memory device can map replacement cells in place of the faulty cells. This remapping process is described in more detail below.

Cell Remapping

Figure 7:
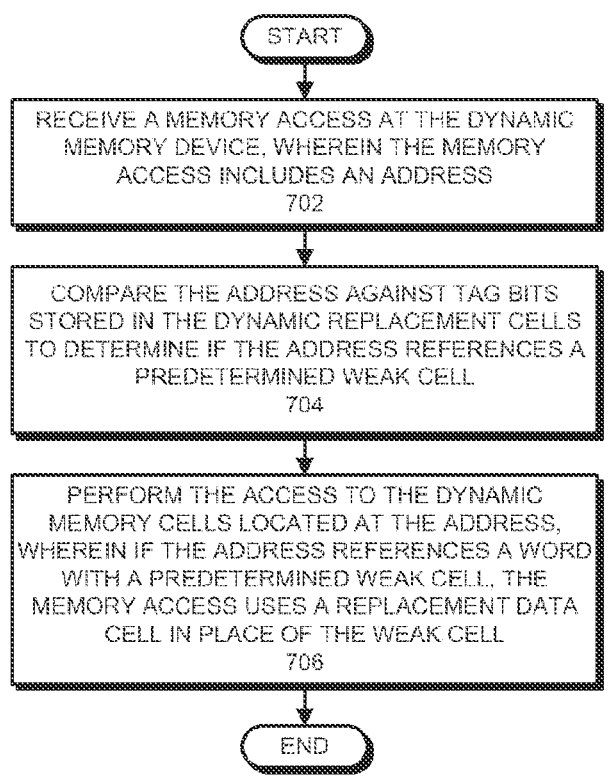
FIG. 7 presents a flow chart illustrating how faulty memory cells are remapped in accordance with the disclosed embodiments.

FIG. 7 presents a flow chart illustrating how faulty cells are automatically remapped during memory operations in accordance with the disclosed embodiments. First, the system receives a memory access (such as a load or a store) at the dynamic memory device, wherein the memory access includes an address (step 702). Next, circuitry within the dynamic memory device compares address bits from the memory access against address bits stored in the set of replacement dynamic memory cells (the tag bits) to determine if the address matches the address of a predetermined faulty cell (step 704). Finally, the dynamic memory device performs the memory access to a dataword, which comprises a group of dynamic memory cells located at the address. During this process, if the address matches an address of a dataword with a predetermined faulty cell, the memory access maps an associated replacement data cell in place of the faulty cell (step 706).

The preceding description was presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein. Accordingly, many modifications and variations will be apparent to practitioners skilled in the art. Additionally, the above disclosure is not intended to limit the present description. The scope of the present description is defined by the appended claims.

Also, some of the above-described methods and processes can be embodied as code and/or data, which can be stored in a computer-readable storage medium as described above. When a computer system reads and executes the code and/or data stored on the computer-readable storage medium, the computer system performs the methods and processes embodied a data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

What is claimed is:

1. A dynamic memory device, comprising:
   a set of dynamic memory cells;
   a set of replacement dynamic memory cells including:
      cells to store replacement data bits for predetermined faulty cells in the set of dynamic memory cells; and
      associated with the cells to store replacement data bits, address cells to store address bits that identify the predetermined faulty cells; and
   a remapping circuit configured to remap an access to a cell in the set of dynamic memory cells with an associated replacement cell in the set of replacement dynamic memory cells.

2. The dynamic memory device of claim 1, wherein the predetermined faulty cells are weak cells that have shorter retention times than other dynamic memory cells in the set of dynamic memory cells.

3. The dynamic memory device of claim 1,
   wherein the set of dynamic memory cells is organized into a set of columns that form a main array; and
   wherein the set of replacement dynamic memory cells is organized into one or more extra columns which are proximate to the main array.

4. The dynamic memory device of claim 1, wherein replacement cells in the set of replacement dynamic memory cells and dynamic memory cells in the set of dynamic memory cells use a similar storage cell design.

5. The dynamic memory device of claim 1, wherein dynamic memory cells in the set of dynamic memory cells are written, and replacement cells in the set of replacement dynamic memory cells are read, in a same column cycle during a sequence of successive column write operations.

6. The dynamic memory device of claim 1,
   wherein dynamic memory cells in the set of dynamic memory cells are written during a normal column-write operation; and
   wherein replacement cells in the set of replacement dynamic memory cells are written by a special write operation used during initialization and maintenance operations.

7. The dynamic memory device of claim 1,
   wherein during a memory access to an address, the remapping circuit is configured to use a first portion of the address to look up a tag in the set of replacement dynamic memory cells, wherein the tag includes a replacement data bit from a replacement data cell and address bits from an associated group of address cells; and
   wherein the remapping circuit includes matching logic which attempts to match a second portion of the address against higher-order address bits from the tag to determine whether the tag matches the address for the memory access.

8. The dynamic memory device of claim 7, wherein if the second portion of the address matches the higher-order address bits from the tag, the remapping circuit is configured to use lower-order address bits from the tag to select a bit to be remapped within a dataword at the address.

9. The dynamic memory device of claim 7, wherein during write operations, address lookups and data lookups are pipelined, so that a lookup to access tag-address bits for a successive memory operation takes place concurrently with a lookup to access replacement data bits and normal data bits for a current memory operation.

10. The dynamic memory device of claim 1, further comprising an initialization mechanism configured to initialize the set of replacement dynamic memory cells, by writing address bits, which identify predetermined faulty cells, into groups of address cells in the set of replacement dynamic memory cells.

11. A method for processing a memory access at a dynamic memory device, comprising:
   receiving the memory access at the dynamic memory device, wherein the memory access includes an address, and wherein the dynamic memory device includes a set of dynamic memory cells and a set of replacement dynamic memory cells;
   comparing the address against address bits stored in the set of replacement dynamic memory cells to determine if the address matches the address of a predetermined faulty cell in the set of dynamic memory cells; and
   performing the memory access to a dataword comprising a group of dynamic memory cells located at the address, wherein if the address matches an address of a dataword with a predetermined faulty cell, such that the memory access uses an associated dynamic replacement cell in place of the faulty cell.

12. The method of claim 11, wherein the set of replacement dynamic memory cells includes data cells which contain replacement data bits for predetermined faulty cells in the set of dynamic memory cells, and address cells which contain address bits identifying the faulty cells, wherein each data cell is associated with a group of address cells which identify an associated faulty cell in the set of dynamic memory cells.

13. The method of claim 11, wherein comparing the address against the address bits stored in the set of replacement dynamic memory cells involves:
   using a first portion of the address to look up a tag in the set of replacement dynamic memory cells, wherein the tag includes address bits which identify an associated faulty cell in the set of dynamic memory cells; and
   attempting to match a second portion of the address against higher-order address bits from the tag to determine whether the address matches the address of an associated predetermined faulty cell in the set of dynamic memory cells.

14. The method of claim 13, wherein mapping the replacement data cell in place of the faulty cell involves using lower-order address bits from the tag to select a bit to be remapped in the dataword located at the address.

15. The method of claim 11, wherein during write operations, address lookups and data lookups are pipelined, so that a lookup to access tag-address bits for a successive memory operation takes place concurrently with a lookup to access replacement data bits and normal data bits for a current memory operation.

16. The method of claim 11, further comprising initializing the set of replacement dynamic memory cells, by writing address bits, which identify predetermined faulty cells, into groups of address cells in the set of replacement dynamic memory cells.

17. The method of claim 11, wherein the predetermined faulty cells can comprise weak cells that have shorter retention times than other dynamic memory cells in the set of dynamic memory cells.

18. The method of claim 11, wherein dynamic memory cells in the set of dynamic memory cells are written, and replacement cells in the set of replacement dynamic memory cells are read, in a same column cycle during a sequence of successive column write operations.

19. The method of claim 11,
   wherein dynamic memory cells in the set of dynamic memory cells are written during a normal column-write operation; and wherein replacement cells in the set of replacement dynamic memory cells are written by a special write operation used during initialization and maintenance operations.

20. A memory system, comprising:
at least one tag memory, which can be volatile or non-volatile;
at least one dynamic memory, wherein the dynamic memory includes a set of dynamic memory cells and a set of replacement dynamic memory cells; and
an initialization mechanism configured to write information from the at least one tag memory to the at least one dynamic memory, wherein the information identifies predetermined faulty cells in the dynamic memory;
wherein the at least one dynamic memory includes remapping circuitry to remap a faulty cell in the set of dynamic memory cells to an associated replacement cell in the set of replacement dynamic memory cells.

21. The memory system of claim 20, wherein the predetermined faulty cells can comprise weak cells that have shorter retention times than other dynamic memory cells in the set of dynamic memory cells.

22. The memory system of claim 20,
wherein the set of dynamic memory cells is organized into a set of columns that form a main array; and
wherein the set of replacement cells is organized into one or more extra columns which are proximate to the main array.

23. The memory system of claim 20, wherein replacement cells in the set of replacement dynamic memory cells and dynamic memory cells in the set of dynamic memory cells use a similar storage cell design.

24. The memory system of claim 20, wherein dynamic memory cells in the set of dynamic memory cells are written, and replacement cells in the set of replacement dynamic memory cells are read, in a same column cycle during a sequence of successive column write operations.

25. The memory system of claim 20,
wherein dynamic memory cells in the set of dynamic memory cells are written during a normal column-write operation; and
wherein replacement cells in the set of replacement dynamic memory cells are written by a special write operation used during initialization and maintenance operations.

26. The memory system of claim 20,
wherein during a memory access to an address, the remapping circuit is configured to use a first portion of the address to look up a tag in the set of replacement cells, wherein the tag includes a replacement data bit from a replacement data cell and address bits from an associated group of address cells; and
wherein the remapping circuit includes matching logic which attempts to match a second portion of the address against higher-order address bits from the tag to determine whether the tag matches the address for the memory access.

27. The memory system of claim 26, wherein if the second portion of the address matches the higher-order address bits from the tag, the remapping circuit is configured to use lower-order address bits from the tag to select a bit to be remapped in a dataword located at the address.

28. The memory system of claim 26, wherein during write operations, address lookups and data lookups are pipelined, so that a lookup to access tag-address bits for a successive memory operation takes place concurrently with a lookup to access replacement data bits and normal data bits for a current memory operation.

29. The memory system of claim 20, wherein the initialization mechanism operates during system boot-up.

30. A method for initializing a dynamic memory device that includes a set of dynamic memory cells and a set of replacement dynamic memory cells, the method comprising:
obtaining identification information for the dynamic memory device;
using the identification information to obtain tag information for the dynamic memory device; and
writing the tag information into the dynamic memory device, wherein the tag information identifies predetermined faulty cells in the dynamic memory cells, so that the dynamic memory device can use replacement cells in place of the faulty cells.

31. The method of claim 30, wherein the predetermined faulty cells can comprise weak cells that have shorter retention times than other dynamic memory cells in the set of dynamic memory cells.

32. The method of claim 30, wherein the initialization takes place during system boot-up.

33. The method of claim 30, wherein looking up the tag information involves using the identification information to retrieve the tag information from a remote server.

34. The method of claim 30, wherein prior to obtaining the identification information, the method further comprises generating the tag information by identifying faulty cells during burn-in testing for the dynamic memory device.

35. The method of claim 30, further comprising:
receiving a memory access at the dynamic memory device, wherein the memory access includes an address;
comparing the address against address bits stored in the set of replacement dynamic memory cells to determine if the address matches the address of a predetermined faulty cell in the set of dynamic memory cells; and
performing the memory access to a dataword comprising a group of dynamic memory cells located at the address, wherein if the address matches an address of a dataword with a predetermined faulty cell, the memory access uses an associated replacement data cell in place of the faulty cell.

36. The method of claim 35, wherein the set of replacement dynamic memory cells includes data cells which contain replacement data bits for predetermined faulty cells in the set of dynamic memory cells, and address cells which contain address bits identifying the faulty cells, wherein each data cell is associated with a group of address cells which identify an associated faulty cell in the set of dynamic memory cells.

37. The method of claim 35, wherein comparing the address against the address bits stored in the set of replacement dynamic memory cells involves:
using a first portion of the address to look up a tag in the set of replacement cells, wherein the tag includes address bits which identify an associated faulty cell in the set of dynamic memory cells; and
attempting to match a second portion of the address against higher-order address bits from the tag to determine whether the address matches the address of an associated predetermined faulty cell in the set of dynamic memory cells.

38. The method of claim 37, wherein using the replacement data cell in place of the faulty cell involves using lower-order address bits from the tag to select a bit to be remapped in a dataword located at the address.

39. The method of claim 35, wherein during write operations, address lookups and data lookups are pipelined, so that a lookup to access tag-address bits for a successive memory operation takes place concurrently with a lookup to access replacement data bits and normal data bits for a current memory operation.

40. The method of claim 35, wherein dynamic memory cells in the set of dynamic memory cells are written, and replacement cells in the set of replacement dynamic memory cells are read, in a same column cycle during a sequence of successive column write operations.

41. The method of claim 35,
wherein dynamic memory cells in the set of dynamic memory cells are written during a normal column-write operation; and
wherein replacement cells in the set of replacement dynamic memory cells are written by a special write operation used during initialization and maintenance operations.

42. The method of claim 35,
wherein during a memory access to an address, the remapping circuit is configured to use a first portion of the address to look up a tag in the set of replacement dynamic memory cells, wherein the tag includes a replacement data bit from a replacement data cell and address bits from an associated group of address cells; and
wherein the remapping circuit includes matching logic which attempts to match a second portion of the address against higher-order address bits from the tag to determine whether the tag matches the address for the memory access.

43. A memory controller, comprising:
a tag memory interface to couple to at least one tag memory;
a dynamic memory interface to couple to at least one dynamic memory, wherein the dynamic memory includes a set of dynamic memory cells and a set of replacement dynamic memory cells; and
an initialization mechanism configured to write information from the at least one tag memory to the at least one dynamic memory, wherein the information identifies predetermined faulty cells in the dynamic memory;
wherein the at least one dynamic memory includes remapping circuitry to remap a faulty cell in the set of dynamic memory cells to an associated replacement cell in the set of replacement dynamic memory cells.

44. The memory controller of claim 43, wherein the predetermined faulty cells can comprise weak cells that have shorter retention times than other dynamic memory cells in the set of dynamic memory cells.

45. The memory controller of claim 43,
wherein dynamic memory cells in the set of dynamic memory cells are written during a normal column-write operation; and
wherein replacement cells in the set of replacement dynamic memory cells are written by a special write operation used during initialization and maintenance operations.

46. The memory controller of claim 43, wherein the initialization mechanism operates during system boot-up.

47. A method for processing a memory access at a dynamic memory device, comprising:
receiving the memory access at the dynamic memory device, wherein the memory access includes an address, and wherein the dynamic memory device includes a set of dynamic memory cells and a set of replacement dynamic memory cells, which are stored in the same types of columns in the dynamic memory device;
using a first portion of the address to look up a tag in the set of replacement dynamic memory cells, wherein the tag includes a replacement data cell which contains a replacement data bit for a faulty cell in the set of dynamic memory cells, wherein the tag also includes address bits which identify the faulty cell;
storing the tag in a latch;
attempting to match a second portion of the address against higher-order address bits from the tag to determine whether the address matches the address of the faulty cell; and
performing the memory access to a dataword comprising a group of dynamic memory cells located at the address, wherein if the address matches an address of a dataword with a predetermined faulty cell, such that the memory access uses an associated dynamic replacement cell in place of the faulty cell.

48. The method of claim 47, wherein after performing the memory access, the method further comprises:
delaying issuance of a subsequent precharge command; and
writing data bits in the tag from the latch to the set of replacement dynamic memory cells from which the tag originated.

* * * * *